United States Patent [19]
Nave

[11] Patent Number: 4,996,488
[45] Date of Patent: * Feb. 26, 1991

[54] MEASURING AND LIMITING EMI WITH A SELECTABLE MODE REFLECTION NETWORK

[76] Inventor: Mark J. Nave, 11833 93rd Ave. North, Seminole, Fla. 33542

[*] Notice: The portion of the term of this patent subsequent to Jul. 18, 2006 has been disclaimed.

[21] Appl. No.: 411,276

[22] Filed: Sep. 22, 1989

Related U.S. Application Data

[63] Continuation-in-part of Ser. No. 356,074, May 24, 1989, and a continuation-in-part of Ser. No. 103,398, Oct. 1, 1987, Pat. No. 4,849,685.

[51] Int. Cl.$^5$ .............................................. G01R 27/00
[52] U.S. Cl. ..................................... 324/613; 324/625
[58] Field of Search ....................... 324/613, 620, 625; 333/12

[56] References Cited

U.S. PATENT DOCUMENTS 4,263,549  4/1981  Toppeto .............................. 324/127
4,849,685  7/1984  Nave .................................. 324/57 N

OTHER PUBLICATIONS

Schnieder, "Noise Source . . . Filter Design", 1983, Proceeding of Powercon 10, pp. 167–175.
Nave, "Predection of Conducted Emissions . . . ", 1986, IEEE Intl. Symposium on EMC.
Toppeto, "Test Method . . . ", 1979, EMC Symposium Rollerdam.

*Primary Examiner*—Walter E. Snow
*Attorney, Agent, or Firm*—Charles A. McClure

[57] ABSTRACT

Selectable mode rejection network (SMRN) for electromagnetic interference (EMI) excludes common mode (CM) and, alternatively, differential mode (DM) conducted emissions (CE) from entering power transmission lines from electrical equipment powered from such lines and producing such unwanted electrical noise. Phase-switching the SMRN determines whether CM or DM is so excluded, thereby facilitating measurement of the unexcluded type of CE. So used in measuring EMI, such SMRN enables improved filter design for the respective types of CE and composite filters for limiting both CM and DM CE.

11 Claims, 2 Drawing Sheets

U.S. Patent   Feb. 26, 1991   Sheet 1 of 2   4,996,488
— PRIOR ART —
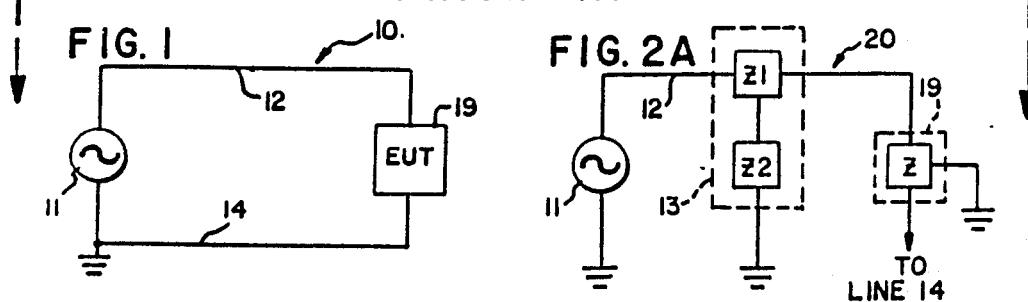
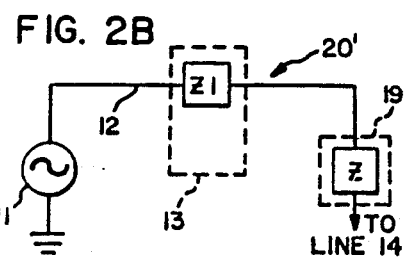
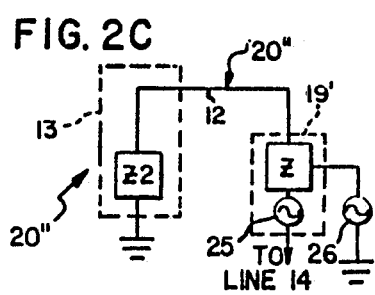
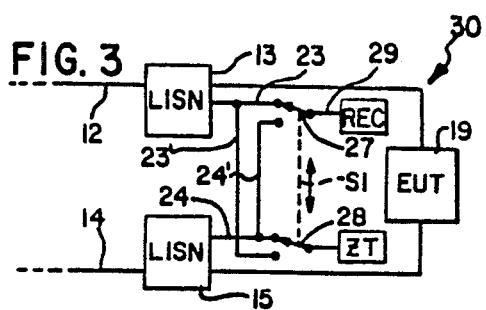
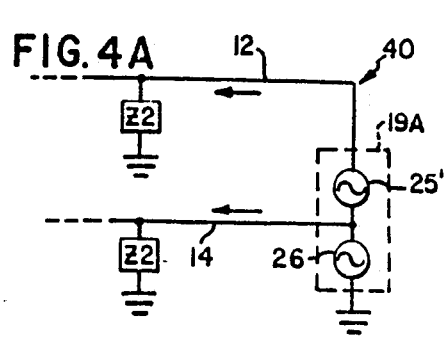
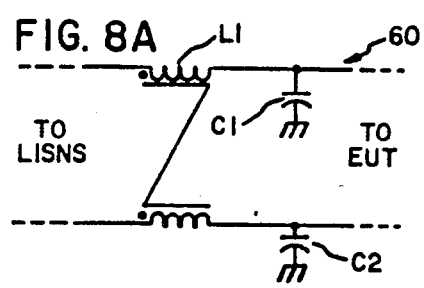
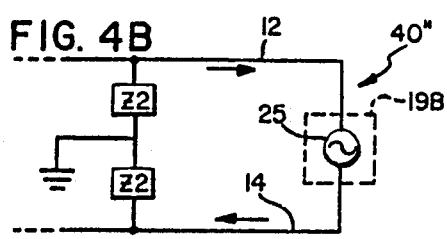
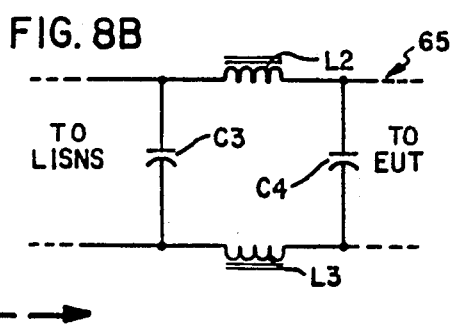
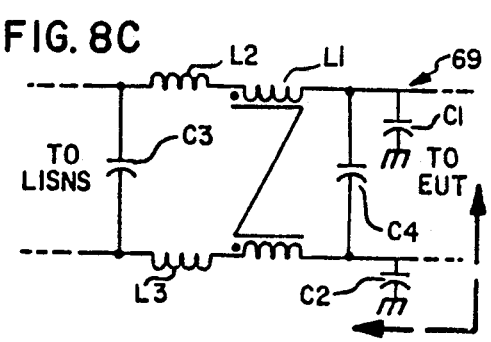

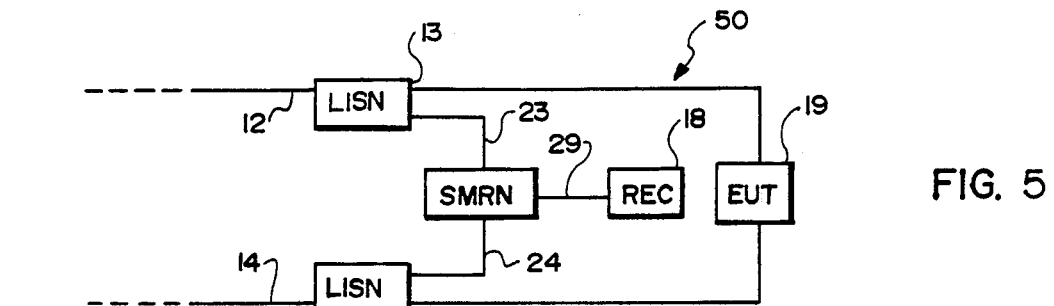
FIG. 5
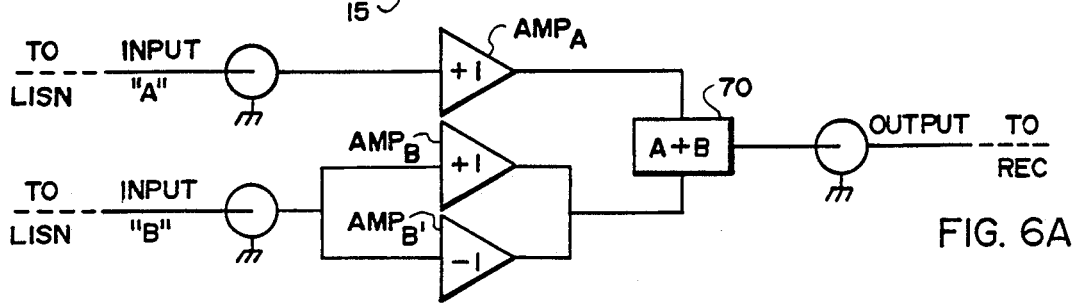
FIG. 6A
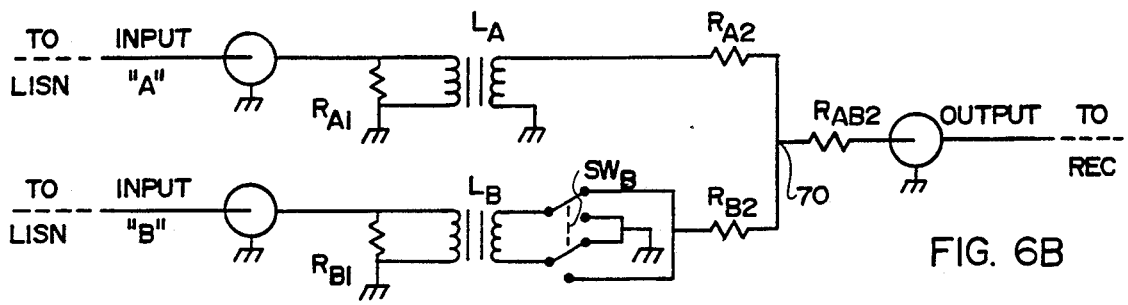
FIG. 6B
FIG. 7
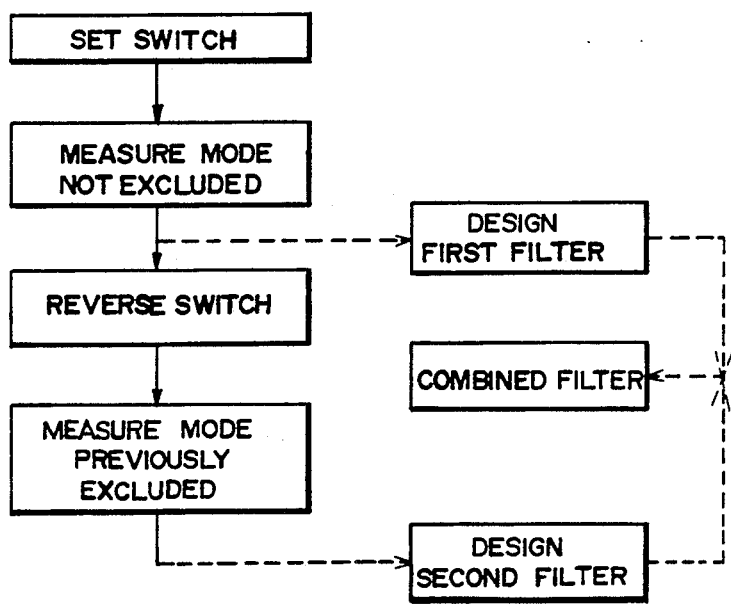

MEASURING AND LIMITING EMI WITH A SELECTABLE MODE REFLECTION NETWORK

This is a continuation-in-part of my copending application, Ser. No. 356,074 filed May 24, 1989, itself a continuation-in-part of my prior application, Ser. No. 103,398 filed Oct. 1, 1987 and now U.S. Pat. No. 4,849,685 granted July 18, 1989.

TECHNICAL FIELD

This invention relates to means and methods for reduction of electromagnetic interference (EMI), such as may be generated in electrical equipment and be conducted back to input power lines. It relates particularly to a selectable mode rejection network (SMRN).

BACKGROUND OF THE INVENTION

Just as electrical power lines may transmit transient surges or other voltage irregularities to electrical equipment intended to be powered therefrom, so equipment in line of such power transmission may cause interfering electrical signals or noise to be conducted back to an intervening electrical bus and even to the power lines.

Such conducted emissions (CE) may degrade computer performance, television picture quality, and the functioning of other electrical equipment powered from such lines. CE types of interference may be generated by computers, radio and TV receivers, motors, switching apparatus, or almost any electrical equipment having (or causing) a varying or random emission, whether as intended output or otherwise.

Filters are useful in reducing such interference, and it is conventional—in determining the desirability and effectiveness of filters—to measure conducted emissions with an instrument often called an EMI meter or spectrum analyzer. Such a meter has a logarithmic (dB) scale and is responsive via a voltage probe or current loop throughout a frequency range up to 30 MHz or higher.

Plotting the results of such measurements reveals whatever interference peaks and bands may exist, so that adequate filters can be designed and be connected to (or be installed in) the equipment under test (EUT) to limit such interference to a tolerable level at all frequencies. Designing such filters may fairly be viewed now as principally an art rather than a science. A need exists for methods and means of empirically determining, with greater facility, filters most suitable to combat both such types of conducted emissions.

Lon M. Schneider and Alphonse A. Toppetto, as well as the present inventor, are well known workers and writers in this field. Their published articles, some listed in my aforementioned patent, are of more interest than are most EMI patents, but Toppetto U.S. Pat. No. 4,263,549 discloses apparatus for determining "differential mode" and "common" mode noise. Common mode (CM) current flows from phase and neutral lines to ground, whereas "differential mode" (DM) current flows from a phase line to a neutral line.

SUMMARY OF THE INVENTION

Whereas my aforesaid patented invention provides an excellent method and means for measuring both CM and DM noise and utilizing such measurements in reducing EMI to a desirably acceptable level, it may be more demanding than some designers need or wish to handle. My present invention is directed toward a more simplified method and means for approximating a similarly desirable result.

A primary object of the present invention also is to facilitate desired reduction of electromagnetic interference from electrical equipment that in its operation is a generator of unintended EMI.

Another object of this invention is to systematize further the designing of filters for limiting EMI to tolerable levels.

A further object of the invention is to provide a sequence of steps for measuring and limiting respective components of EMI.

Yet another object is to provide a specific circuitry of a mode selection device useful during the performance of such steps.

A still further object of the invention is to provide a technique for measuring source impedance.

In general, the objects of this invention are accomplished by interposing a selectable mode rejection network between LISN-terminated phase and neutral power lines and their output to equipment under test (EUT), to enable either the common mode (CM) or the differential mode (DM) outputs to add in phase—and the other to cancel out—depending upon selectable mode switch setting.

When DM contributions from the respective phases are out of phase (as they normally are) they cancel one another out, and the common mode (CM) contributions add together. In the opposite setting of the phase-reversing selectable mode switch, CM contributions cancel one another because then they are out of phase, and the DM contributions add together.

A filter designer can design a filter to exclude whichever type of noise is measured in the one position and then exclude the other type as measured in the other position. A resulting combined filter should exclude both types well enough to comply with EMI limits.

Other object of this invention, together with methods and means for accomplishing the various objects, will become apparent from the following description and the accompanying drawings, presented here by way of example rather than limitation.

SUMMARY OF THE DRAWINGS

FIG. 1 is a schematic electrical diagram of the interconnection of an A.C. power source to an electrical load, here equipment to be put under test (EUT) for electromagnetic interference (EMI);

FIG. 2A is a similar schematic view of a power line impedance stabilization network (LISN) interposed between the power source and the EUT—only one of the power lines to the EUT being shown, for the sake of simplicity; and FIGS. 2B and 2C are views showing the equivalent electrical circuits of the apparatus of FIG. 2 at, respectively, conventional power frequency and a much higher frequency characterized by EMI;

FIG. 3 is a schematic view of the same apparatus connected conventionally to an EMI receiver for measurement of its EMI;

FIGS. 4A and 4B are schematic diagrams of "common mode" (CM) and "differential mode" (DM) conducted emissions (CE) from the EUT, especially part thereof acting to generate noise.

FIG. 5 is a schematic electrical diagram of the connection of the EUT and the EMI receiver as in FIG. 3, with the addition of a selectable mode rejection network (SMRN) interposed between the line impedance stabilization networks (LISNs) and the EMI receiver (REC), in accordance with this invention;

FIG. 6A is a schematic block diagram of such SMRN electrical circuitry for use with single-phase input power sources;

FIG. 6B is a circuit diagram of such SMRN for like use;

FIG. 7 is a block diagram of a method of limiting EMI from an EUT according to this invention, using an SMRN as in FIG. 5; and FIGS. 8A, 8B, and 8C are schematic representations of an EUT with, respectively, a CM filter, a DM filter, and a composite or resulting filter interposed between it and the input power lines.

DESCRIPTION OF THE INVENTION

FIG. 1 shows, in conventional schematic manner, circuitry 10 wherein A.C. electrical power source 11 has ungrounded phase line 12 and grounded neutral line 14 leading to electrical load EUT 19. It will be understood, of course, that the same power lines have numerous other electrical loads (not shown) on them and that any one or more of such loads may generate EMI and propagate it as conducted emissions via the power transmission lines to other connected loads. Filters are needed between the power lines and the load equipment of such a conventional hookup to limit conduction of such emissions back to the power lines and, thus, to other equipment so powered.

FIG. 2A shows in similar manner circuitry 20, wherein LISN 13 is interposed between line 12 and ground. The LISN is intended to provide a stabilized impedance to emissions conducted from the EUT to the power lines, without interference with the normal supply of power to the EUT. Grounded neutral line 14 (not shown here) is also provided with a like LISN. LISN 13 is made up of first impedance element Z1 (largely inductive) in series in the line and second impedance element Z2 (largely capacitive) in series between the inductive impedance and ground. Impedance Z of the EUT is also shown as connected to ground (through parasitics) and to neutral line 14 (through the operational load).

FIGS. 2B and 2C are simplified schematic views to show DM and CM effective source impedances at ordinary power frequency (FIG. 2B) and at much higher or "noise" frequencies (FIG. 2C).

FIG. 2B shows effective circuitry 20' of the apparatus of FIG. 2A at power frequency, say 50 to 60 Hz, whereby inductive Z1 is low in impedance, and capacitive Z2 is so high in impedance as to be practically open circuit—and, therefore, is omitted from view.

FIG. 2C shows effective circuitry 20'' of the apparatus of FIG. 2A at high or noise frequency, whereby inductive Z1 is so high in impedance as to be practically an open circuit and, thus, is omitted from this view—along with the power source—whereas capacitive Z2 is very low in impedance. EMI source 25 (DM) is indicated in series between impedance element Z within the EUT (now designated 19') and neutral line 14, and EMI source 26 (CM) is indicated in series between the same impedance element and ground.

FIG. 3 shows schematically conventional circuitry 30, wherein LISN 13 is interposed in phase line 12, and LISN 15 is interposed in neutral line 14 leading to EUT 19, and wherein EMI receiver 18 and equivalent termination impedance ZT are connectable alternately via double-pole double-throw switch S1 to the respective LISNs. Here upper switch arm 27 connects the phase line LISN (via lead 23) to EMI receiver (REC) lead 29, while lower switch arm 28 connects the neutral line LISN (via lead 24) to the ZT unnumbered lead. Such switch setting leaves unconnected alternative LISN leads 23' and 24' which interchange the LISN connections to REC and ZT.

Such a conventional measuring arrangement fails to distinguish between "common mode" conducted emissions and "differential mode" conducted emissions, leaving filter design quite experimental and uncertain—even when the desirability of distinguishing between CM CE and DM CE is appreciated. The next views further emphasize that customary failure to cope with the practical problem.

FIG. 4A shows schematically effective circuitry 40' of CM CE at high or noise frequencies. Impedance elements Z2 between ground and respective phase and neutral power lines 12 and 14 receive currents from indicated source 25'—denoting whatever component(s) of the EUT act(s) as a source of such EMI. As CM CE currents (arrows) flow in the same direction at any given time in each of the power lines, source 26 is shown between both lines and ground. The EUT itself is marked 19A to distinguish it from its previous simpler representation, and load Z is omitted.

FIG. 4B shows similarly the effective circuitry 40'' of DM CE at high or noise frequencies. Pair of impedance elements Z2 between respective phase and neutral power lines 12 and 14 and ground receive currents from source 25 of the EUT (now 19B) and circulate or flow in opposite directions in the two lines.

FIG. 5 shows schematically circuitry 50 for use in practicing the method of the present invention. This arrangement resembles FIG. 3 except that "selectable mode rejection network" (SMRN) 55 is interposed between EMI receiver 18 and respective leads 23 and 24 to the LISNs. The utility of such SMRN will become apparent in the description of how and when to use it in measurements of EMI.

FIG. 6A shows in block or similar schematic form positive (+1) amplifier $AMP_A$ in a shielded line from $LISN_A$ and shows positive amplifier $AMP_B$ and negative (−1) amplifier $AMP_B$, in parallel with one another in line from $LISN_B$. The amplifier outputs are summed (as A+B) algebraically at junction 70 and go via a shielded lead to EMI receiver REC. Switch $SW_B$ enables either the positive or the negative amplifier in the $LISN_B$ line to be connected at will. Thus, when both amplifiers have positive output, the output of in-phase (CM) noise (halved by the voltage dividers), will add together, and the output of exactly out-of-phase (DM) noise will be nullified; whereas when the amplifiers have opposite outputs, the net output is out-of-phase (DM) noise, and the in-phase (CM) noise becomes nil.

FIG. 6B is an equivalent of 6A in which $AMP_A$ is specifically provided as transformer $L_A$, and $AMP_B$ is provided as transformer $L_B$. Resistors $R_{A1}$ and $R_{B1}$ are across the primary windings of the respective transformers, each with one end grounded. Switch $SW_B$ shown connectable to either end of the ungrounded secondary of the second transformer simultaneously grounds the other end of its winding. The outputs from the respective transformers pass through respective resistors $R_{A2}$ and $R_{AB2}$ to junction 70, and the combined output goes from there through resistor $R_{AB2}$ to EMI receiver REC.

In view of standard (in the U.S.) termination requirement of 50 ohms for LISNs and for an EMI receiver, each R₁ resistor (whether A or B) has a value of 50 ohms, and each R₂ resistor (A, B, or AB) has a value of 16 ⅔ ohms. European countries may prefer a higher LISN impedance (say, 100 or 150 ohms), but the respective resistor values can be scaled readily from the 50-ohm termination.

Such SMRN is used in only a part of an EMI measuring process, but its use is critical to success of the measurement and to the effectiveness of consequent filter design, as will be understood from the next diagram and from description of it and subsequent views.

FIG. 7 shows in block form successive steps of the present invention, which inherently provides alternative ways of proceeding, corresponding to beginning with either CM (preferably) or DM as net output depending upon the initial setting of the phase switch. In generality, the method is characterizable succinctly as a preliminary step of (i) setting the phase switch and thereby excluding by cancellation one mode of conductive emissions (CE), followed by the steps of (ii) measuring the unexcluded mode of CE, (iii) reversing the setting of the phase switch and (iv) measuring the previously excluded but now unexcluded other mode of CE.

After either or both of the measuring steps, the measurement(s) is (are) used in conventional manner to design a filter adapted to filter one (both) of the modes of CE out. Two individual filters or a single combined filter so designed (and connected to or included in the equipment) are effective to reduce EMI very substantially, if not entirely. Care should be taken to recheck both types of emissions to ensure that nothing occurred in adding or combining filters to disturb effective filtration of either mode of CE.

FIGS. 8A, 8B, and 8C illustrate circuitry generally, whether in the prior art (as marked) or according to this invention when this teaching is followed therein. Whereas prior art methodology at best only approximates effective values, in the practice of this invention the specified values of the various circuit elements provide highly effective filtering out of EMI. These last three views are described here principally from this improved perspective with reference to the foregoing sequence of steps, notwithstanding application of the illustrations generally to attempts of the prior art to accomplish effective EMI filtering. In other words, to the extent they incorporate the means or methods of the present invention, these FIGS. are not merely prior art though they are properly so considered (and designated) when not enhanced by this invention.

FIG. 8A shows schematically the apparatus upon interposition of CM filter 60 between the power lines and the EUT after step (b); FIG. 8B shows additionally interposed DM filter 65 after step (d); and FIG. 8C shows filter 69, a composite of 60 and 65 so interposed. Producing such a composite filter from two individually determined filters is well known and can be accomplished by persons of ordinary skill, once values of the respective filter components are known.

Notwithstanding the specificity of the foregoing description, variants have been suggested, and other modification may be made, as by adding, combining, deleting, or subdividing parts or steps, while retaining at least part of the advantages and benefits of the present invention—which itself is defined in the following claims.

The claimed invention:

1. Selectable mode rejection network (SMRN) useful in the measurement of electromagnetic interference (EMI) from electrical equipment powered from electrical transmission lines through respective line impedance stabilization networks (LISNs), by means of an EMI receiver (REC), such measurement being useful in the design of filters for limiting EMI conducted emissions (CE) to such lines, comprising a pair of first circuit elements, each having a given first resistive impedance, adapted to connect in series between the respective transmission line LISNs and ground, and a like pair of second circuit elements, each having a given resistive impedance unlike the first, connected respectively in series between such first circuit elements and a junction between them and the REC lead, and another such second circuit element connected in series between such junction and such REC lead; and phase-switching means between one of such first circuit elements and such junction adapted to switch between two positions, being effective in one position to add CM CE from both lines and to cancel out DM CE from both lines, and being effective in the other position to add DM CE from both lines and to cancel out CM CE from both lines.

2. Selectable mode rejection network (SMRN) useful in the measurement of electromagnetic interference (EMI) from electrical equipment powered from electrical transmission lines through respective line impedance stabilization networks (LISNs), by means of an EMI receiver (REC), such measurement being useful in the design of filters for limiting EMI conducted emissions (CE) to such lines, comprising a pair of first circuit elements, each having a given first resistive impedance, adapted to connect in series between the respective transmission line LISNs and ground, and a like pair of second circuit elements, each having a given resistive impedance unlike the first, connected respectively in series between such first circuit elements and a junction between them and the REC lead, and another such second circuit element connected in series between such junction and such REC lead; and phase-switching means between one of such first circuit elements and such junction adapted to switch between two positions, being effective in one position to add CM CE from both lines and to cancel out DM CE from both lines, and being effective in the other position to add DM CE from both lines and to cancel out CM CE from both lines, and including a pair of like transformers, each having a primary winding with one end grounded and the other end connected to such a LISN, and a secondary winding, the secondary winding of one of the transformers having one end grounded and the other end connected to the REC lead, the secondary winding of the other transformer having either of its ends grounded and the other end connected to the REC lead, dependent upon the setting of the phase-switching means.

3. Selectable mode rejection network (SMRN) useful in the measurement of electromagnetic interference (EMI) from electrical equipment powered from electrical transmission lines through respective line impedance stabilization networks (LISNs), by means of an EMI receiver (REC), such measurement being useful in the design of filters for limiting EMI conducted emission (CE) to such lines, comprising a pair of first circuit elements, each having a given first resistive impedance, adapted to connect in series between the respective transmission line LISNs and ground, and predetermined in accordance with required termination impedance for an EMI receiver used as a standard test instrument, wherein the value of R1 is so predetermined, and the value of R2 is such that the sum $R2+(R1+R2)/n=R1$, where n is the number of transmission lines;

a like pair of second circuit elements, each having a given resistive impedance unlike the first, connected respectively in series between such first circuit elements and a junction between them and the REC lead, and another such second circuit element connected in series between such junction and such REC lead; and phase-switching means between one of such first circuit elements and such junction adapted to switch between two positions,
being effective in one position to add CM CE from both lines and to cancel out DM CE from both lines, and
being effective in the other position to add DM CE from both lines and to cancel out CM CE from both lines.

4. An SMRN according to claim 3, wherein R1 equals 50 ohms and R2 equals 16 ⅔ ohms.

5. An SMRN according to claim 1, comprising circuitry including such R1 and R2 circuit elements, a pair of leads therefrom for connection to the respective transmission lines, and another lead therefrom for connection to the EMI receiver.

6. An SMRN according to claim 5, including LISNs in the respective first pair of leads.

7. An SMRN according to claim 5 including a housing enclosing the respective circuit elements.

8. In apparatus including receiving means for measuring electromagnetic interference (EMI) conducted emissions (CE) from electrical equipment under test (EUT) powered by an electrical power source via transmission lines having line impedance stabilization networks (LISNs) interposed between the respective lines and the EUT during measurement, the improvement comprising a selectable mode rejection network (SMRN) connected between the LISNs and the receiving means, effective to exclude either differential mode (DM) CE or common mode (CM) CE from measurement, and having
a given resistance between each LISN and ground, and
a like resistance between the power lines and EMI receiving means (REC).

9. Apparatus according to claim 8, including switching means operable to select which CE type is excluded.

10. In apparatus including receiving means for measuring electromagnetic interference (EMI) conducted emissions (CE) from electrical equipment under test (EUT) powered by an electrical power source via transmission lines having line impedance stabilization networks (LISNs) interposed between the respective lines and the EUT during measurements, the improvement comprising a selectable mode rejection network (SMRN) connected between the LISNs and the receiving means, effective to exclude either differential mode (DM) CE or common mode (CM) CE from measurement, and having
a given resistance between each LISN and ground, and
a like resistance between the power lines and EMI receiving means (REC); and
switching means operable to select which CE type is excluded; including a pair of like transformers, each having
a primary winding with one end grounded and the other end connected to such a LISN, and
a secondary winding,
the secondary winding of one of the transformers having one end grounded and the other end connected to the REC lead,
the secondary winding of the other transformer having either of its ends grounded and the other end connected to the REC lead, dependent upon the selected setting of the switching means.

11. In apparatus including receiving means for measuring electromagnetic interference (EMI) conducted emissions (CE) from electrical equipment under test (EUT) powered by an electrical power source via transmission lines having line impedance stabilization networks (LISNs) interposed between the respective lines and the EUT during measurement, the improvement comprising a selectable mode rejection network (SMRN) connected between the LISNs and the receiving means, effective to exclude either differential mode (DM) CE or common mode (CM) CE from measurement, and having
a given resistance between each LISN and ground, and
a like resistance between the power lines and EMI receiving means (REC); and
switching means operable to select which CE type is excluded; wherein the switching means is connected to the secondary winding of the latter transformer and is adapted to interchange the respective ends of such winding between
(i) connection to ground, and
(ii) connection to the EMI receiver.

* * * * *